United States Patent [19]
Dao et al.

[11] Patent Number: 5,618,643
[45] Date of Patent: Apr. 8, 1997

[54] EMBEDDED PHASE SHIFTING MASK WITH IMPROVED RELATIVE ATTENUATED FILM TRANSMISSION

[75] Inventors: Giang T. Dao, Fremont; Gang Liu, Santa Clara, both of Calif.

[73] Assignee: Intel Corporation, Santa Clara, Calif.

[21] Appl. No.: 573,526

[22] Filed: Dec. 15, 1995

[51] Int. Cl.$^6$ ........................................ G03F 9/00
[52] U.S. Cl. ........................ 430/5; 430/322; 430/324
[58] Field of Search ................... 430/5, 322, 324

[56]  References Cited

U.S. PATENT DOCUMENTS

| 5,354,632 | 4/1992 | Dao et al. | 430/5 |
| 5,415,953 | 2/1994 | Alpay et al. | 430/5 |
| 5,480,747 | 11/1994 | Vasudev | 430/5 |

OTHER PUBLICATIONS

"The Attenuated Phase Shifting Mask," *Solid State Technology*, pp. 43–47, Jan. 1992.

*Primary Examiner*—S. Rosasco
*Attorney, Agent, or Firm*—Blakely, Sokoloff, Taylor & Zafman

[57]  ABSTRACT

A method and apparatus for fabricating a mask for use in patterning a radiation sensitive layer in a lithographic printer. An embedded phase shifting layer is disposed over a substantially transparent base layer such that attenuated regions of the mask are phase shifted approximately 160 to 200 degrees relative to open features in the mask. In accordance with the present invention, radiation transmission is reduced through the open feature regions of the mask. In one embodiment, a thin radiation transmission reducing layer is deposited over the open feature regions of the mask. In another embodiment, the open feature regions of the mask are roughened to reduce radiation transmission. In yet another embodiment, ion implantation is performed in the open feature regions of the mask to reduce transmission. With the reduced transmission of radiation through the open feature regions of the present mask, high resolution lithography employing short wavelength radiation is realized.

19 Claims, 6 Drawing Sheets

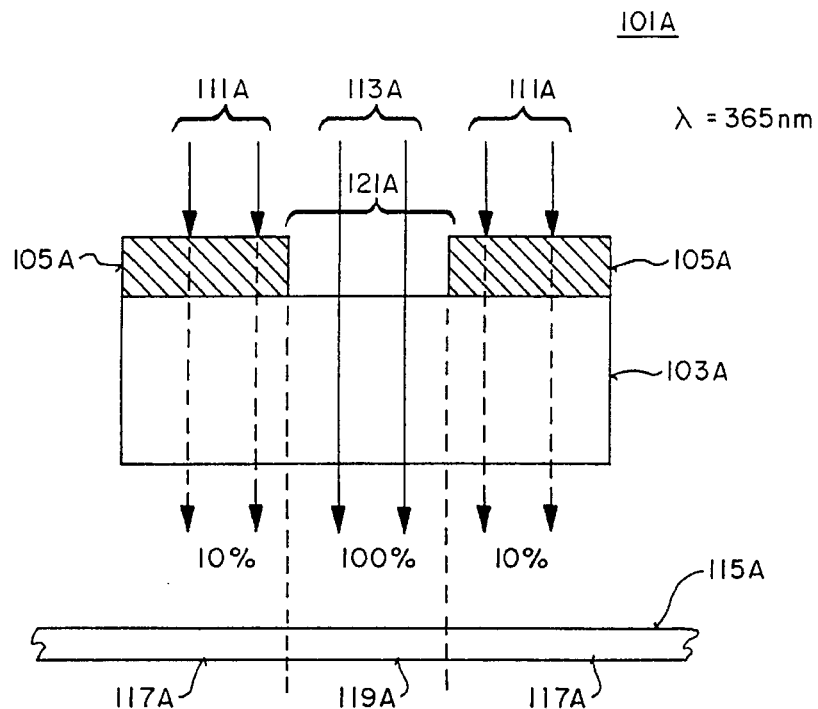
FIG_1A (PRIOR ART)
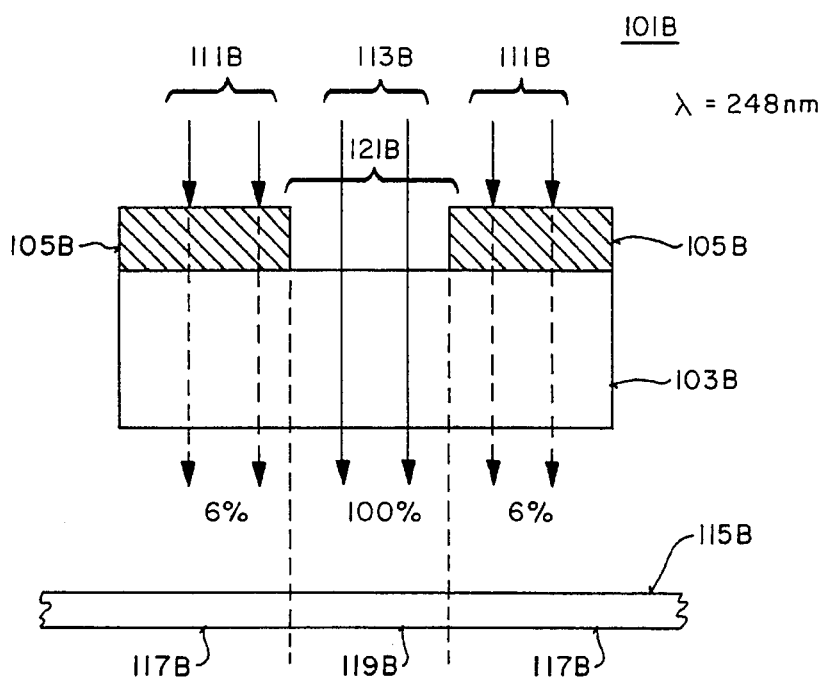
FIG_1B (PRIOR ART)

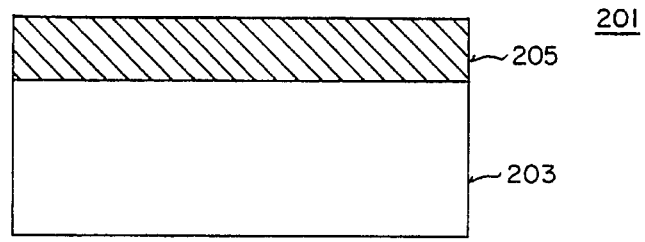
FIG _ 2A
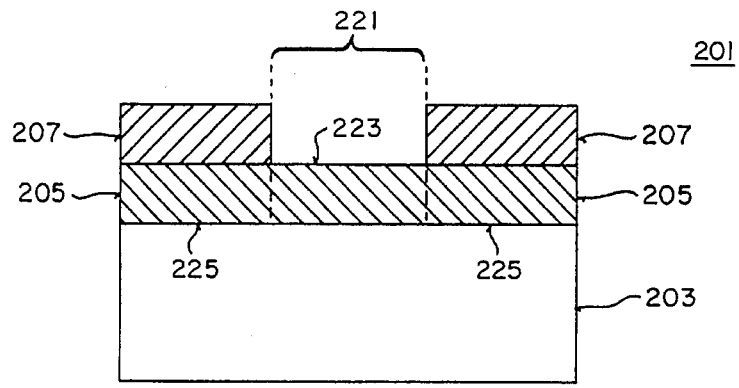
FIG _ 2B
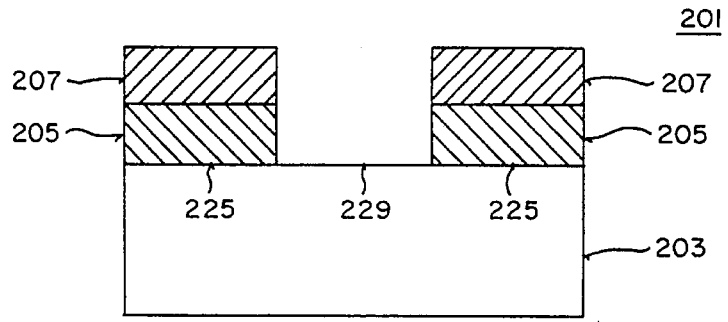
FIG _ 2C
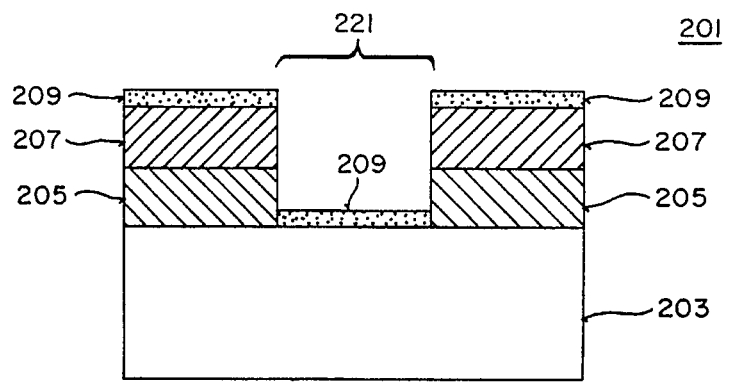
FIG _ 2D

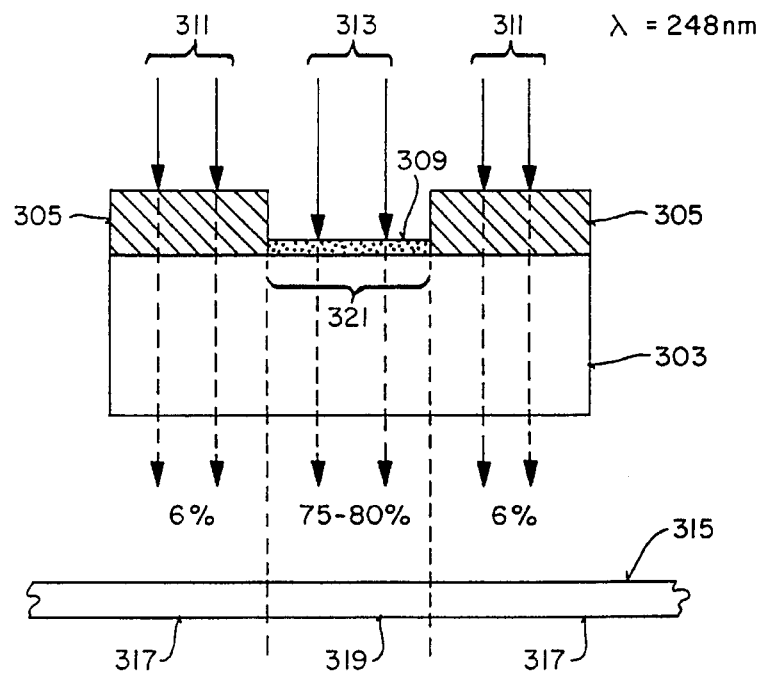
FIG_3
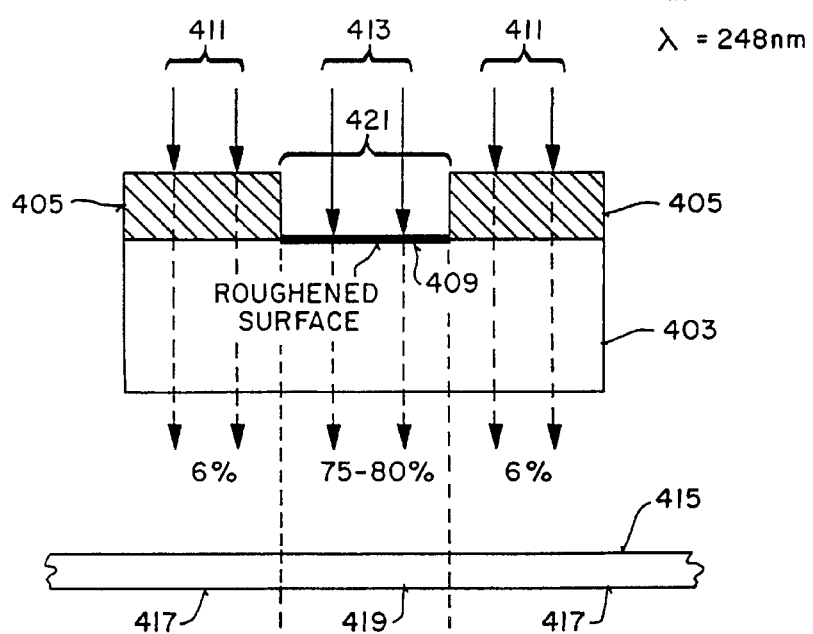
FIG_4

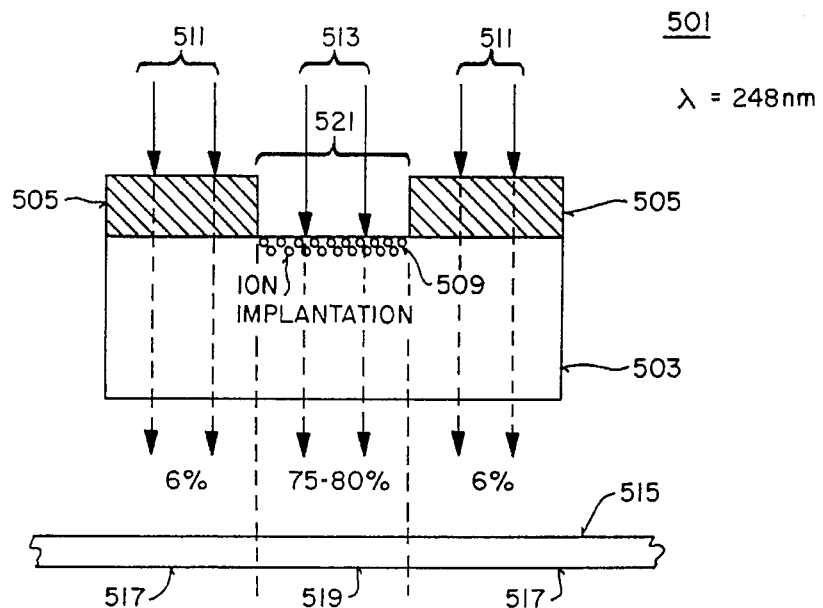
FIG_5
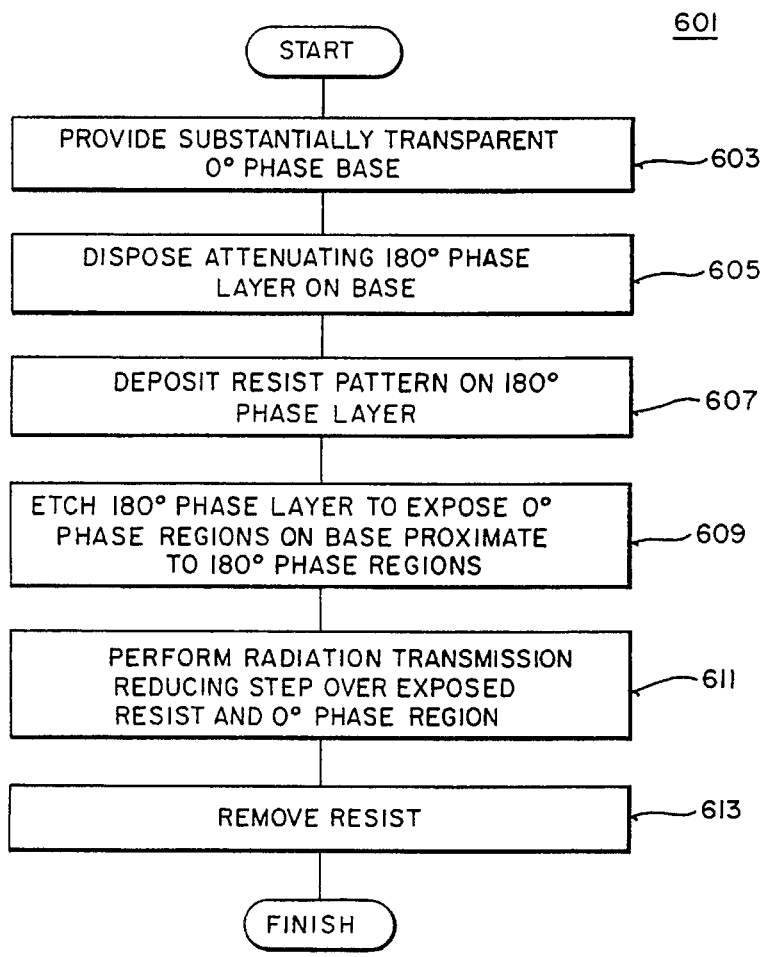
FIG_6

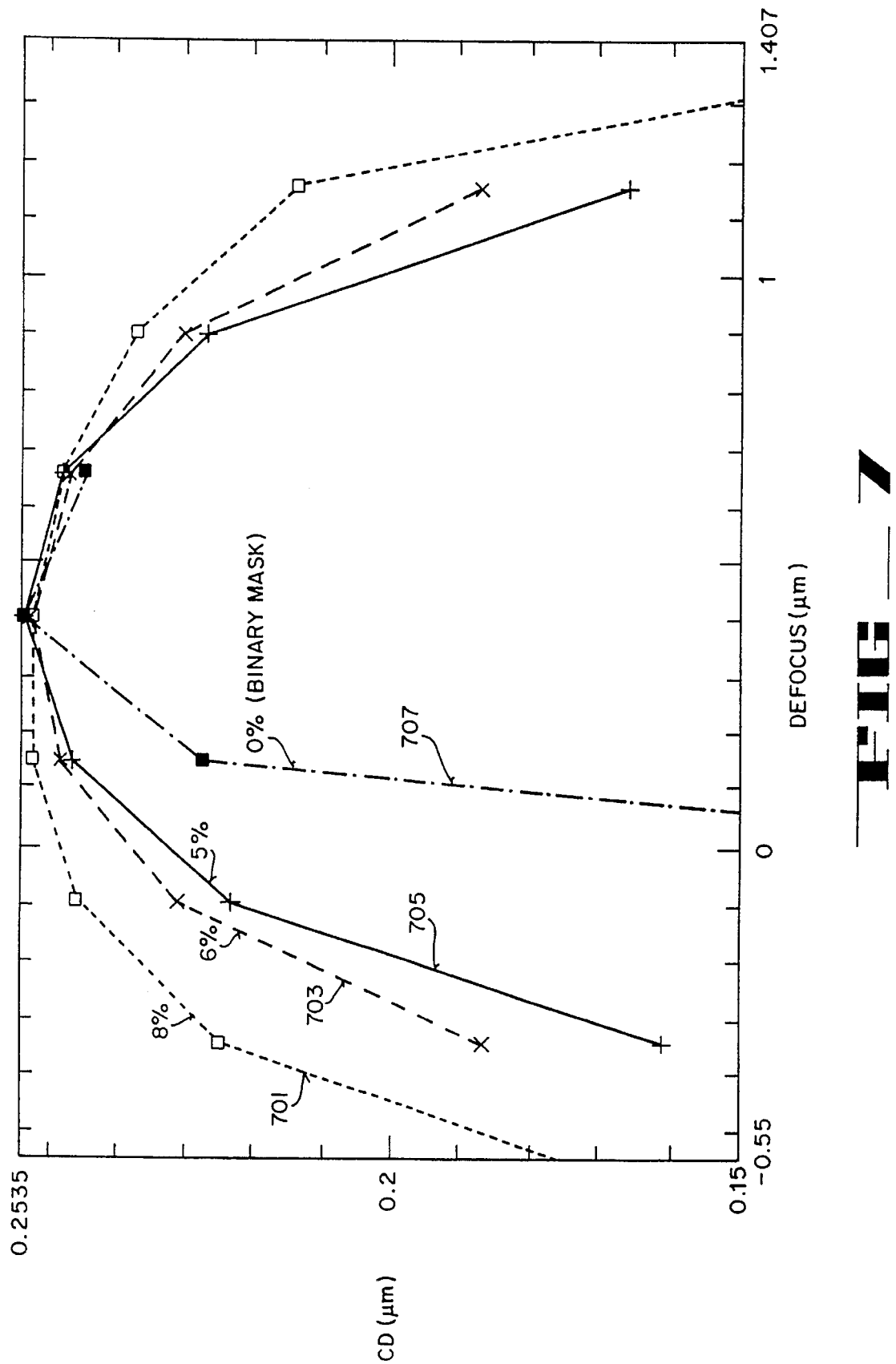
FIG—7

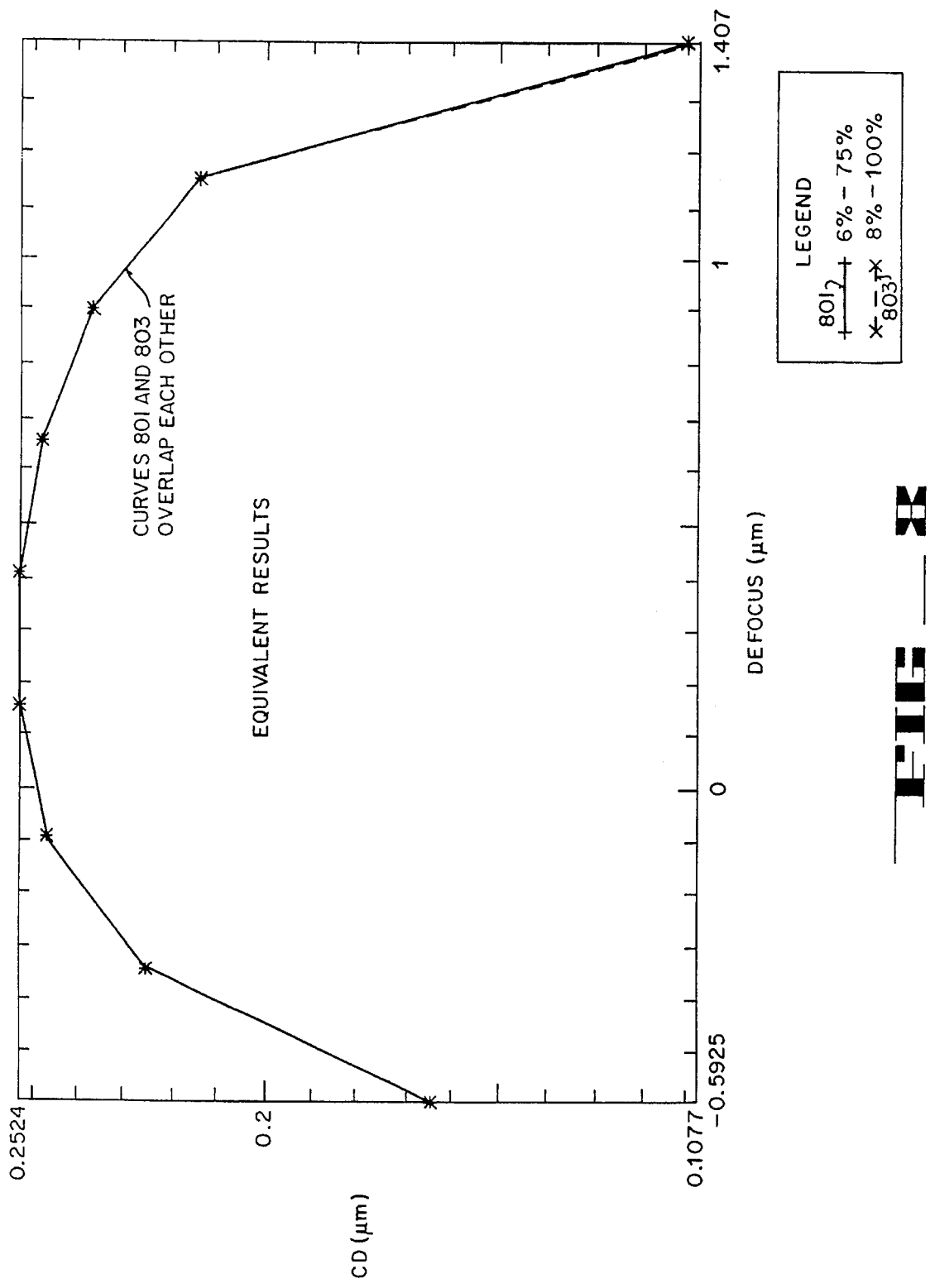
FIG_X

1

EMBEDDED PHASE SHIFTING MASK WITH IMPROVED RELATIVE ATTENUATED FILM TRANSMISSION

FIELD OF THE INVENTION

The present invention relates to masks used in patterning radiation sensitive layers and more specifically, the present invention relates to a method and an apparatus for fabricating a mask using attenuated phase shifting.

BACKGROUND OF THE INVENTION

In the semiconductor industry there is a continuing effort to increase device density by scaling device size. State of the art devices currently have device features with a dimension well below one micron (submicron). To form these features, a photosensitive layer is formed on a substrate or device layer and is exposed to radiation through a reticle. Herein, all such reticles will be referred to as masks. Typically, a mask comprises a substantially transparent base material, e.g. quartz, with an opaque layer having the desired pattern formed thereon as is well known. During device fabrication, the mask is placed over a photosensitive material and incident radiation is provided to the mask. The transparent regions allow the radiation to pass through to the photosensitive material and the opaque regions block out the incident radiation. For one prior art mask design, the opaque regions are made of chrome deposited on a quartz mask. The open regions in the chrome, comprise transparent quartz regions that transmit substantially all the incident radiation.

When fabricating devices at the submicron level, radiation diffraction effects become significant. As a result, portions of the photoresist layer underlying the opaque layer near the edges of the device features are exposed to some diffracted radiation. To minimize the effects of diffraction, phase shifting masks have been used in the prior art.

One type of phase shifting mask employs transparent "phase regions" that transmit some or all of the incident radiation. The phase regions are positioned proximate to open feature regions on the mask which are used to define device features. The phase region shifts the phase of incident radiation approximately 180 degrees relative to zero degree regions, or open feature regions. The radiation transmitted through the 180 degree phase region destructively interferes at the boundaries with radiation from the open feature region, thereby reducing the intensity of radiation incident on the photoresist surface underlying the opaque layer near a feature edge providing good contrast at the boundary of the feature.

In a continuing effort to reduce feature sizes in semiconductor integrated circuits, state of the art semiconductor devices have been requiring smaller and smaller dimensional patterns. The patterns may be formed within a photoresist layer as long as a masked pattern can be resolved within the photoresist layer. The resolution limit which is herein defined as the smallest dimension that can be resolved within the photoresist layer while maintaining an acceptable process window is about:

$$k_1 \frac{\lambda}{NA} \quad \text{(Equation 1)}$$

where $k_1$ is a "constant" for a given lithographic process (process constant), $\lambda$ is the wavelength of the radiation, and NA is the numerical aperture of the lens. One skilled in the art appreciates that $k_1$ is not a true constant but can actually vary. A conventional prior art mask has chrome elements in the opaque regions and openings between the chrome elements. A conventional prior art mask has a $k_1$ of about 0.8. The resolution limit using a conventional prior art mask is hereinafter called the conventional resolution limit and is about 0.8 $\lambda$/NA. When $\lambda$ is about 365 nanometers and NA is about 0.54, the conventional resolution limit is about 0.54 micrometers.

As efforts to reduce semiconductor device sizes have continued, another prior art method that has been employed is the use of attenuated phase shifting masks (APSM). The APSM replaces the opaque layer of prior art masks (which is typically a layer of chrome about 0.1 micrometers thick) with a "leaky" layer which transmits a reduced or attenuated percentage of the radiation incident thereon. For example, a very thin layer of chrome (approximately 300 Å) could be used as the leaky layer. With i-line radiation, or radiation having a wavelength of approximately 365 nanometers, a chrome layer this thin will transmit approximately 10% of the radiation incident on the mask. Additionally, the leaky chrome layer shifts the phase of the transmitted radiation approximately 30° compared to the radiation transmitted through regions of the mask where the leaky chrome layer is not present.

In order to achieve the desired 180° shift, the features are phase shifted an additional 150° degrees, either by etching the mask or by placing a phase shifting material in the open feature regions of the mask. That is, the APSM comprises a layer of leaky chrome covering the entire mask base except for the features which are open regions (i.e. regions having no thin chrome layer) with appropriate phase shifting.

To adjust the phase shift, the phase shifting element must have a known index of refraction. The thickness of the phase shifting element varies depending on the wavelength of the radiation source and the index of refraction of the phase shifting material used. In general, the phase shifting element's thickness is about:

$$\frac{\lambda}{2(n-1)} \quad \text{(Equation 2)}$$

where $\lambda$ is the wavelength of the radiation and n is the material's index of refraction. Thus, by etching the mask to vary the thickness of the material, the phase shift can be adjusted.

Prior art methods have improved upon the APSM by replacing the leaky chrome layer with films which not only reduce the transmission of radiation but also shift the phase of the radiation transmitted by the desired 180°. Masks employing these improved films which reduce the transmission of radiation as well as shift phase by 180° are referred to as embedded phase shifting masks (EPSM). Materials employed in EPSMs include chrome based materials, as well as films made of molybdenum silicide, titanium nitride and silicon nitride among others.

In FIG. 1A, prior art EPSM 101a is shown. Prior art EPSM 101a is comprised of substantially transparent base material 103a with layer of phase shifting material 105a. Incident radiation 113a is applied to EPSM 101a and is transmitted through the open feature regions 121a of the transparent base material 103a such that open feature 119a of photosensitive layer 115a is exposed to 100% of radiation 113a. Radiation 111a incident upon embedded phase shifting layer 105a is transmitted through EPSM 101a and is applied to regions 117a of photosensitive layer 115a. With a radiation wavelength of 365 nanometers, regions 117a of photo sensitive layer 115a is exposed to approximately 8–12% of radiation 111a is transmitted through phase shifting layer 105a with a phase change of 180° relative to radiation 113a exposed to open feature 119a.

With the prior art EPSM 101a shown in FIG. 1, good contrast is realized at feature boundaries. As a result of the destructive interference which occurs between radiation 111a transmitted through the 180° regions associated with phase shifting layer 105a, and the radiation 113a transmitted through the 0° regions associated with substantially transparent base region 103a, it is appreciated that the destructive interference which occurs between transmitted radiation 111a and 113a provides good contrast at feature boundaries.

It is also appreciated that the 8–12% transmission of radiation 111a through embedded phase shifting layer 105a is not excessive. That is, embedded phase shifting layer 105a is sufficiently "opaque" so as to image and form the desired device patterns on photosensitive layer 115a. If embedded phase shifting layer 105a transmits an excessive amount of radiation 111a, then EPSM 101a would effectively have no "opaque" regions. If, on the other hand, phase shifting layer 105a transmits an inadequate amount of radiation 111a, then the benefits of the destructive interference between the 180° and 0° regions would not be realized. Thus, it is appreciated that phase shifting layers 105a in prior art EPSMs transmit phase shifted radiation in a range of approximately 8–12% to be effective.

It is noted that the 8–12% range described above is merely discussed as an example and that other photosensitive materials may exist which may have optimal lithographic performance when exposed to radiation with EPSMs that transmit phase shifted radiation in a range other than 8–12%. An important point to note is that depending on the photosensitive material used, there exists an optimal percentage of 180° phase shifted radiation transmitted through the EPSM film relative to the corresponding base material to achieve good lithographic performance.

To illustrate better the effects of 180° radiation transmitted through phase shifting layers of prior art EPSMs, FIG. 7 shows the results of simulations comparing critical dimension (CD) versus defocus with varying transmission percentages for 0.25 micrometer contact printing. It is understood that the actual values can vary considerably based upon the feature being formed, exposure parameters, including time and energy of exposure, printer parameters and other factors.

In FIG. 7, curve 701 is a plot representing a CD versus defocus relationship for an EPSM having an 8% transmission. Curve 703 represents an EPSM having a 6% transmission, curve 705 represents an EPSM having a 5% transmission and curve 707 represents a binary mask with an opaque region which transmits 0% radiation. As can be appreciated by those having skill in the art, curve 701 with an 8% radiation transmission exhibits much improved performance as compared to curves 703, 705 and 707. It is also appreciated that by increasing the transmission of radiation from 6% to 8%, a 30% gain in depth of focus is obtained.

With efforts to reduce feature sizes in semiconductor integrated circuits continuing, the resolution limits of semiconductor devices fabricated using radiation wavelengths of 365 nanometers have been reached. As can be seen in Equation 1 above, the resolution limit is directly proportional to radiation wavelength λ. Therefore, increased resolution may be achieved with shorter radiation wavelengths. Accordingly, those skilled in the art have begun efforts to use radiation having shorter wavelengths than i-line radiation, such as deep ultraviolet (DUV) radiation, which has a wavelength of approximately 248 nanometers, for the lithographic fabrication of semiconductor devices. By using DUV with EPSMs, increased resolution should be achieved in accordance with Equation 1 above. However, problems have arisen with prior art EPSMs when using DUV radiation.

As shown in FIG. 7, simulation data clearly indicate that better lithographic performance is obtained with higher radiation transmission through the EPSM layer. Although it is noted that excessive radiation transmission through the EPSM layer may lead to unacceptable resist loss on the wafer level and, in particular, to sidelobe printing, a common problem with attenuated phase shifting mask applications, it is nevertheless desired to have reasonable radiation transmission through the EPSM layer. It is noted that the EPSM film must simultaneously meet a number of requirements such as radiation transmission, 180° phase shifting and chemical resistance. With these limitations in mind, most EPSM films presently under development, for example MoSiON film, are limited to about 6% for 248 nm radiation. Furthermore, the radiation transmittance is expected to be reduced further with radiation wavelengths of 193 nm and shorter due to absorption at shorter wavelengths.

To illustrate, FIG. 1B shows prior art EPSM 101b comprised of substantially transparent base material 103b with embedded phase shifting layer 105b disposed over base material 103b. Radiation 113b having a wavelength equal to 248 nanometers is transmitted through the open feature region 121b of EPSM 101b through transparent base material 103b and is applied to open feature 119b of photosensitive layer 115b at an intensity of 100%. DUV radiation 111b is transmitted through phase shifting layers 105b and is applied to regions 117b of photosensitive layer 115b.

Due to the EPSM film limitations described above, it is noted that a maximum of only 6% of DUV radiation 111b is transmitted through embedded phase shifting layers 105b, unlike the 8–12% transmission of i-line radiation 111a through phase shifting layers 105a in FIG. 1A. Assuming that an 8–12% transmission of radiation is the desired transmission through the EPSM film for the photosensitive material used in this example, the 6% transmission of 180° phase shifted radiation is inadequate to realize the benefits of the destructive interference which should occur at the feature boundaries with 0° phase shifted radiation.

Therefore, what is needed is a method to improve the relative transmission of radiation through EPSM film as compared to the corresponding base material such as a quartz substrate to an optimal value such that adequate lithographic performance is achieved.

SUMMARY OF THE INVENTION

A method and an apparatus for fabricating a mask for use in patterning a radiation sensitive layer in a lithographic printer is disclosed. In one embodiment, an embedded phase shifting layer is disposed over substantially transparent base material such that attenuated regions of the mask are phase shifted approximately 160 to 200 degrees relative to the open feature regions of the mask. In accordance with the present invention, the transmission of radiation incident upon the open feature regions is reduced. With the reduction of radiation transmission through the open feature regions of the mask described herein, high resolution lithography employing embedded phase shifting masks using short wavelength radiation is realized. Additional features and benefits of the present invention will become apparent from the detailed description, figures and claims set forth below. Other objects, features, and advantages of the present invention will be apparent from the accompanying drawings and from the detailed description which follows below.

BRIEF DESCRIPTION OF THE DRAWINGS

The present invention is illustrated by way of example and not limitation in the accompanying figures and in:

FIG. 1A illustrates a cross section of a prior art embedded phase shifting mask with radiation having wavelength of 365 nanometers incident thereupon.

FIG. 1B illustrates a cross-section of a prior art embedded phase shifting mask with radiation having a wavelength of 248 nanometers incident thereupon.

FIGS. 2A–D illustrate cross sections of the fabrication of an embodiment of the present invention.

FIG. 3 illustrates a cross section of an embodiment of the present invention using a thin layer of chrome or a like substance.

FIG. 4 illustrates a cross section of an embodiment of the present invention employing a roughened surface.

FIG. 5 illustrates a cross section of an embodiment of the present invention employing ion implantation.

FIG. 6 illustrates the process employed by the present invention in block diagram form.

FIG. 7 illustrates the CD versus defocus relationship for prior art EPSMs with varying transmission percentages.

FIG. 8 illustrates the CD versus defocus relationship for the present invention.

DETAILED DESCRIPTION

A method and an apparatus for fabricating a mask for use in patterning a radiation sensitive layer in a lithographic printer is disclosed. In the following description, numerous specific details are set forth such as specific materials, mask patterns, dimensions, etc. in order to provide a thorough understanding of the present invention. It will be obvious, however, to one skilled in the art, that the specific details need not be employed to practice the present invention. In other instances, well known materials or methods have not been described in detail in order to avoid unnecessarily obscuring the present invention.

In the present invention, regions on the mask are referred to as 0° and 180° phase regions, It should be appreciated that the actual phase of the radiation through the 0° region of the mask may be any nominal value and the 180° phase region merely shifts the incident radiation by approximately plus or minus 180° from that nominal value. Moreover, the phase shifting between the first and second region need not be exactly 180° in order to be effective. The difference may be anywhere between approximately 160° to 200°. However, when the phase difference between the two regions is as close as possible to 180°, the destructive interference between the two phase regions is maximized. In addition, it is also appreciated that the 0° phase and 180° phase region nomenclature is not necessarily meant to indicate the actual phase of radiation transmitted through a region or the actual phase difference between two regions. It is noted that any nominal or actual phase of a region or phase difference between regions encompasses all 360° multiples of the phase or phase difference.

The present invention will be illustrated with the use of features which form openings in the photoresist similar to for example, contact openings. It will be understood in the present invention that other features such as lines and spaces or other features may be used in the practice of the present invention.

In the present invention, a variety of materials and equipment can be used although the present invention is described in conjunction with a positive photoresist it will readily be appreciated that the present invention may be practiced using any type of photosensitive layer including positive photoresist, negative photoresist, contrast enhanced photoresist and resist materials that are patterned using radiation having a wavelength outside of the visible light spectrum.

The mask used in the present invention may be made of different materials. The substantially transparent base material or substrate may comprise quartz, glass, silicon, silicon nitride, silicon oxynitride, boron nitride or other equivalent materials. With regard to the present invention's embedded or attenuating phase shifting layer, materials such as chrome, molybdenum silicide, titanium nitride, silicon nitride, or other equivalent materials may be used.

The present invention may be used with any lithographic printer regardless of radiation wavelength and numerical aperture. It is noted however, that increased resolution, depth of focus and contrast are appreciated with the present invention by using radiation having wavelengths less than i-line (365 nanometers), e.g. 248 nanometers or 193 nanometers.

In one embodiment of the present invention, a semiconductor substrate is coated with a positive photoresist layer and is place in a lithographic printer. In the embodiment, the lithographic printer is a DUV projection printer which uses a radiation source that emits radiation having wavelength of approximately 248 nanometers and a lens with a numerical aperture of approximately 0.50. It is appreciated however, that lithographic printers other than the projection type printer type used in the described embodiment such as contact printers and proximity printers may be employed by the present invention.

Referring now to FIG. 2A, a cross-section view of one embodiment of a portion of mask 201 of the present invention is shown. Mask 201 comprises substantially transparent base material 203. In the described embodiment, base material 203 is made of quartz and transmits nearly all of the radiation incident thereon. It is appreciated that other materials may be used for base material 203 so long as the material exhibits similar characteristics to the quartz material described herein.

Disposed over base material 203 is embedded phase shifting layer 205. In the described embodiment, embedded phase shifting layer 205 is comprised of materials which transmit radiation incident thereupon with a phase change of approximately 160°–200° in comparison with base material 203 and reduce the transmission of 248 nanometer radiation to approximately 6%, which is less than the desired value.

In an alternative embodiment of the present invention, embedded phase shifting layer 205 may be comprised of materials which merely attenuate the radiation and change the phase of transmitted radiation incident thereupon by amounts other than 160°–200°. In those alternative embodiments, subsequent processing to base material 203 is performed to result in a net 180° phase difference between radiation transmitted by phase change layer 205 and base material 203. Such processing may be accomplished by subsequent etching of the quartz base 203 in open feature regions in accordance with Equation 2 above, to achieve the 180° net phase difference between phase shifting layer 205 and base material 203.

Next as shown in FIG. 2B, a resist layer 207 is disposed over phase change layer 205 to produce a desired semiconductor device pattern. In the present example, feature opening 221 provides an open region for a feature such as a contact. It is appreciated that other features, for example lines or spaces, in semiconductor devices may be fabricated using the present invention. As shown in FIG. 2B, region 223 of phase change layer 205 is left uncovered by resist layer 207. In contrast, remaining regions 225 of phase change layer 205 are protected or covered by resist layer 207. The exposure of region 223 subjects that region of phase change layer 205 to removal by etching as shown in the following FIG. 2C. Note that after etching region 223 of phase change layer 205 has been removed exposing surface 229 of base material 203. Phase change regions 225, or 180° regions, remain intact after etching since they are protected by resist layers 207.

In the described embodiment of the present invention, as shown in FIG. 2D, a radiation transmission reducing layer 209 is deposited over the exposed regions of resist layers 207 and base material 203. In the described embodiment, a thin layer of chrome is employed as layer 209. As will be described in detail below, the thin chrome layer 209 acts to reduce the transmission of radiation incident thereupon. It is appreciated that other materials may be used in accordance with the present invention besides chrome, so long as layer 209 reduces the transmission of radiation.

In the described embodiment, radiation transmission reducing layer 209 reduces the transmission of radiation incident thereupon to approximately 75 to 80%. As is well known in the art, a layer of chrome with a thickness of approximately 1100 Å would reduce the transmission of radiation to 0%. Accordingly, a thinner layer of chrome 209 is deposited over resist layers 207 and open feature region 221 of base material 203 as shown in FIG. 2D.

After the radiation transmission reducing layer 209 has been deposited, resist layer 207 is removed. Accordingly, the portion of radiation transmission reducing layer 209 that is disposed over resist layer 207, is also lifted off during the resist removal step. As a result, phase shifting mask 301 of the present invention is fabricated as shown in FIG. 3.

Phase shifting mask 301 comprises substantially transparent base material 303 with an open feature region 321. Proximate to the open feature region 321 are 180° phase shifting regions which correspond with embedded phase shifting layer 305. Radiation transmission reducing layer 309 remains intact in the open feature 321.

Referring for a moment to FIG. 6, process flow diagram 601 briefly summarizes the basic procedural steps employed by the present invention. As shown in block 603, a substantially transparent base material is provided. Next, as shown in block 605, an attenuating phase shifting layer is disposed over the base. Next, in block 607, the resist layer is formed over the phase shifting layer in a device pattern forming the open feature regions of the mask. As indicated in block 609, etching is subsequently performed to remove the phase shifting layer from the open regions of the mask. Once the open regions are formed, the radiation transmission reducing step is performed next as shown in block 611. In the embodiment described above, this encompasses depositing a thin layer of chrome over the open features and the resist layer. Finally, as shown block 613, the resist layer is removed. The removal of the resist layer lifts off the thin layer of chrome which is disposed over the resist layer. The thin layer of chrome remains intact over the open feature regions of the mask.

Referring back now to FIG. 3, radiation 311 is incident upon embedded phase shifting layer 305. The radiation in the present embodiment has a wavelength of 248 nanometers. Embedded phase shifting layer 305 transmits radiation 311 such that regions 317 of photosensitive layer 315 are exposed to 6% of radiation 311. As also shown in FIG. 3, radiation 313 is incident upon thin chrome layer 309 in the open feature region 321 which is proximate to the 180° regions corresponding with embedded phase shifting layer 305. Radiation 313 also has a wavelength of 248 nanometers. With thin chrome layer 309, region 319 of photosensitive layer 315 is exposed to approximately 75 to 80% of radiation 313 at phase 180° relative to the radiation 311 exposed to regions 317.

It is noted that with the present invention, the exposure dose of radiation is increased to compensate for the reduced transmission of radiation through the open feature region. For example, in one embodiment of the present invention, the exposure dose is increased by 33% from 42 mj/cm$^2$ to 56 mj/cm$^2$.

Referring now to FIG. 8, the results of a simulation study comparing the critical dimension versus defocus is shown with respect to the present invention for 0.25 micrometer contact printing. In FIG. 8, curves 801 and 803 are compared. Curve 803 represents the CD versus defocus relationship of an ideal embedded phase shifting mask which transmits 8% through the attenuating phase shifting regions and 100% through the open regions. In the plot, radiation having wavelength of 248 nanometers in used in conjunction with a numerical aperture setting of 0.5. Similarly, curve 801 represents the CD versus defocus relationship the present embedded phase shifting mask which transmits 6% of the radiation incident upon the phase shifting regions and only 75% of the radiation incident upon the open feature regions. As with plot 803, the radiation used has a wavelength of 248 nanometers and the numeric aperture setting has a value of 0.5.

As shown in FIG. 8, plots 801 and 803 overlap each other. As can be appreciated by those having skill in the art, both curves show EPSMs exhibiting identical acceptable performance with adequate depth of focus. Therefore, FIG. 8 shows exactly the same lithographic performance for an EPSM film with 6% transmission over 75% transmission quartz substrate as compared to an EPSM film with 8% transmission over 100% transmission quartz for 0.25 micrometer contact printing. Hence, by reducing the transmission through the open feature regions of the embedded phase shifting mask from 100% down to 75%, the present embedded phase shifting mask effectively exhibits the same characteristics as the embedded phase shifting mask which transmits 8% through the phase shifting regions with 100% transmitted through the open feature regions. Thus, the beneficial results of the destructive interference between the 180° regions and the 0° regions of the embedded phase shifting mask are realized with radiation having wavelength of 248 nanometers.

Referring back now to embedded phase shifting mask 101b of FIG. 1B, the benefits of the present invention can now be appreciated. As already discussed above, embedded phase shifting layer 105b limits the amount of radiation transmitted through it to only 6% due to manufacturing limitations of the EPSM film. Thus, the benefits of the destructive interference which occurs between the open regions and the phase shifting regions have only limited effect with EPSM 101b. However, with the present invention, by reducing the transmission of radiation through the open feature regions of the embedded phase shifting mask, to approximately 75 to 80%, a 6% transmission of radiation incident upon the phase shifting regions of the embedded phase shifting mask is now sufficient to create an adequate amount of destructive interference between the 0° and the 180° regions for good contrast with the present embedded phase shifting mask.

In FIG. 4, an alternate embodiment of the present invention embedded phase shifting mask 401 is shown. Similar to embedded phase shifting mask 301, mask 401 comprises substantially transparent base material 403 with embedded phase shifting layer 405 disposed over base layer 403. Open region 421 is proximate to the regions covered by embedded phase shifting layer 405.

Unlike embedded phase shifting mask 301, where the open feature region 321 of base material 303 was covered with a thin layer of chrome 309, the open feature region 421 of base material 403 is "roughened," as shown as ROUGHENED SURFACE 409 in FIG. 4. ROUGHENED SURFACE 409 may be created with a variety of techniques, such as dry etching or other equivalents. In effect, ROUGHENED SURFACE 409 performs the same function as thin chrome layer 309 in embedded phase shifting mask 301 by scattering some of the radiation incident thereon. In particular, note that radiation 413, having a wavelength of 248 nanometers, is incident upon roughened surface 409 of base material 403. ROUGHENED SURFACE 409 then scatters as some of the radiation 413. Open region 419 of photo sensitive layer 415 is correspondingly exposed to a 75 to 80% transmission of radiation 413. Similar to embedded phase shifting mask 301, radiation 411 is incident upon embedded phase shifting layer 405. Regions 417 of photosensitive layer 415 are correspondingly exposed to a 6% transmission of radiation 411 at a phase of 180° relative to radiation 413 exposed to region 419. Thus, as shown in FIG. 4, the open feature region 419 is exposed to 75 to 80% transmission of 0° radiation while regions 417 are exposed to 6% transmission of 180° phase radiation. Therefore, with the reduced transmission of radiation through open feature region 421, embedded phase shifting mask 401 exhibits the same CD versus defocus relationship as shown in plot 801 of FIG. 8. With ROUGHENED SURFACE 409 scattering some of the radiation, and thereby reducing the transmission thereof, adequate destructive interference is provided with embedded phase shifting layer 405 even though only 6% of radiation 411, having a wavelength of 248 nanometers, is transmitted through embedded phase shifting layer 405.

In FIG. 5, yet another embodiment of the present invention embedded phase shifting mask 501 is shown. Similar to the previously described embodiments, embedded phase shifting mask 501 comprises substantially transparent base material 503 with embedded phase shifting layer 505 disposed over base material 503. Embedded phase shifting layer 505 is disposed over base material 503 in a pattern proximate to open feature region 521. Instead of depositing a thin chrome layer as in embedded phase shifting mask 301, or roughening the surface of the open feature region as an embedded phased shift mask 401, the open feature region 521 of embedded phase shifting mask 501 is subjected to ion implantation as shown in FIG. 5 as ION IMPLANTATION 509.

In the presently described embodiment, the exposed surface of the base material 503 corresponding with open feature region 521 is bombarded with ions such that ions are driven into the surface of base material 503 to reduce effectively the transmission of radiation incident thereupon. It is appreciated that a variety of ions may be used in the present invention to reduce the transmission of radiation. For example, arsenic, boron or other equivalent materials may be used in the ion implantation step in accordance with the present invention.

As shown in FIG. 5, radiation 511 having a wavelength of 248 nanometers is incident upon embedded phase shifting layer 505. Accordingly, regions 517 of photosensitive layer 515 are exposed to a 6% transmission of radiation 511. Radiation 513 also having a wavelength of 248 nanometers, is incident upon the open feature region 521 of base material 503 with ION IMPLANTATION 509 present over the open feature 521 surface of base material 503. Open feature 519 of photosensitive layer 515 is exposed to a 75 to 80% transmission of radiation 513 at a 180° phase relative to radiation 511 exposed to regions 517.

Therefore, similar to the previously described embodiments, the open feature region 519 receives a 75 to 80% transmission of 0° radiation while the other regions 517 of photo sensitive layer 515 receive a 6% transmission of 180° radiation. As described in detail above, a 6% transmission of 180° phase radiation supplies adequate destructive interference with the 75 to 80% transmission of 0° radiation for good contrast and depth of field for the features on photosensitive layer 515.

Thus, an embedded phase shifting mask with improved relative attenuated film transmission has been described.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

The present embedded phase shifting mask provides optimum performance for lithographic applications by providing higher effective radiation transmission through the EPSM films as compared to corresponding base materials. That is, if the amount of radiation transmitted through an EPSM film is limited to a less than optimal amount for whatever reason, the present invention provides a mask and a method for increasing the effective relative transmission of radiation through the EPSM film as compared to corresponding base materials, such as for example quartz substrates, so as to provide adequate lithographic performance.

In the forgoing detailed description, an apparatus and a method of fabricating an embedded phase shifting mask with improved relative attenuated film transmission is described. The apparatus and method of the present invention has been described with reference to specific exemplary embodiments thereof. It will, however, be evident that various modifications and changes may be made thereto without departing from the broader spirit and scope of the present invention. The present specification and drawings are accordingly to be regarded as illustrative rather than restrictive.

What is claimed is:

1. A method of fabricating a mask for use in patterning a radiation sensitive layer in a lithographic printer comprising the steps of providing a first region on a mask, the first region transmitting substantially all of the radiation incident thereon;

disposing a second region on the mask proximate to the first region, the second region substantially reducing the transmission of radiation incident thereon, wherein the radiation transmitted through the second region is phase shifted approximately 160 to 200 degrees relative to the radiation transmitted through the first region; and reducing the transmission of radiation incident on the first region.

2. The method described in claim 1 wherein the step of reducing the transmission of radiation further comprises disposing a first layer on the first region so as to reduce the transmission of radiation through the first region.

3. The method described in claim 2 wherein the step of disposing the first layer on the first region comprises the steps of:

provoding a layer of resist on the second region wherein the resist is not on the first region;

depositing the first layer on the first region and on the resist; and removing the resist so as to remove the first layer from the second region, wherein the first layer remains intact on the first region.

4. The method described in claim 3 wherein the first layer comprises chrome.

5. The method described in claim 2 wherein the first layer reduces the transmission of radiation so as to increase the effective transmission of radiation through the second region as compared to the first region during lithographic printing.

6. The method described in claim 2 wherein the radiation transmitted through the second region is unaffected by the first layer.

7. The method described in claim 1 wherein the step of reducing the transmission of radiation comprises roughening a surface of the first region so as to reduce the transmission of radiation through the first region.

8. The method described in claim 1 wherein the step of reducing the transmission of radiation comprises performing ion implantation on a surface of the first region so as to reduce the transmission of radiation through the first region.

9. The method described in claim 1 wherein the radiation wavelength is less than approximately 365 nanometers.

10. A mask for use in patterning a radiation sensitive layer in a lithographic printer comprising:

a first region transmitting a substantial portion of the radiation incident thereon;

a second region proximate to the first region, the second region transmitting a substantially reduced portion of the radiation incident thereon, wherein the radiation through the second region is phase shifted 160 to 200 degrees relative to the radiation transmitted through the first region; and a third region disposed on the first region proximate to the second region, the third region reducing the transmission of radiation incident thereon.

11. The mask described in claim 10 wherein the third region reduces the transmission of radiation such that the effective transmission of radiation through the second region is increased as compared to the first region during lithographic printing.

12. The mask described in claim 10 wherein the third region comprises chrome.

13. The mask described in claim 10 wherein the third region comprises a roughened surface, the roughened surface reducing radiation transmission.

14. The method in claim 10 wherein the third region comprises a surface of the first region, the surface subjected to ion implantation so as to reduce the transmission of radiation through the first region.

15. The mask described in claim 10 wherein the transmission of radiation is unaffected by the third region.

16. A method for fabricating a mask for use in patterning a radiation sensitive layer in a lithographic printer comprising the steps of:

providing a substantially transparent base material;

disposing a first layer on the base material, the first layer substantially reducing a transmission of radiation incident thereupon, the first layer transmitting radiation incident thereupon with a phase change in a range of approximately 160 to 200 degrees;

disposing a resist layer on the first layer, the resist layer selectively disposed on the first layer in a pattern such that a first region of the first layer on which the resist layer is selectively disposed upon is covered and a second region of the first layer on which the resist layer is not selectively disposed upon is uncovered;

etching the first layer such that the second region of the first layer is removed, a region of the base material is uncovered and the first region remains intact on the base material;

depositing a second layer on the second region of the base material and the selectively disposed resist layer, the second layer reducing the transmission of radiation incident thereupon; and removing the resist layer such that the second layer deposited on the second region remains intact and the second layer deposited on the resist layer is removed.

17. The method described in claim 16 wherein the second layer reduces the transmission of radiation thereupon so as to increase the effective transmission of radiation through the first region as compared to the second region during lithographic printing.

18. The method described in claim 16 wherein the second layer comprises chrome.

19. The method described in claim 16 wherein the base material comprises quartz.

* * * * *